United States Patent [19]

Brilka

[11] Patent Number: 5,714,915
[45] Date of Patent: Feb. 3, 1998

[54] OSCILLATOR

[75] Inventor: Joachim Brilka, Hamburg, Germany

[73] Assignee: U.S. Philips Corporation, New York, N.Y.

[21] Appl. No.: 655,532

[22] Filed: May 30, 1996

[30] Foreign Application Priority Data

Jun. 2, 1995 [DE] Germany .................. 19520244.9

[51] Int. Cl.$^6$ .................................................. H03B 5/12
[52] U.S. Cl. .................... 33/117 R; 331/177 V; 331/179
[58] Field of Search .................... 331/36 C, 117 R, 331/117 FE, 167, 168, 177 V, 179

[56] References Cited

U.S. PATENT DOCUMENTS 5,434,543  7/1995  Brilka et al. .................. 331/117 R

*Primary Examiner*—David Mis
*Attorney, Agent, or Firm*—Steven R. Biren

[57] ABSTRACT

An oscillator (1) includes first frequency-determining elements (13–16) for providing a first oscillation frequency, at least second frequency-determining elements (23, 24) connectable to the first frequency-determining elements (13–16) via at least a switching diode (25, 26) for adjusting the oscillator (1) to a second oscillation frequency, the oscillator further having a supply circuit (27–44, 54) which includes at least a controllable current source (27–30), the supply circuit being coupled to the switching diode (25, 26) for optionally switching the switching diode between a conducting state and a blocked state, and having a current source (4) feeding the oscillator (1). In this oscillator, an improved operating behavior is achieved in that the current source (4) feeding the oscillator (1) is switchable by the supply circuit (27–44, 54), jointly with the connection of the controllable current source (27–30) to a supply current which is dimensioned with respect to a current available from the controllable current source (27–30) in such a way that influences exercised on the operating point and the oscillation amplitude of the oscillator (1) are at least substantially compensated by the connection of at least one of the second frequency-determining elements.

18 Claims, 1 Drawing Sheet

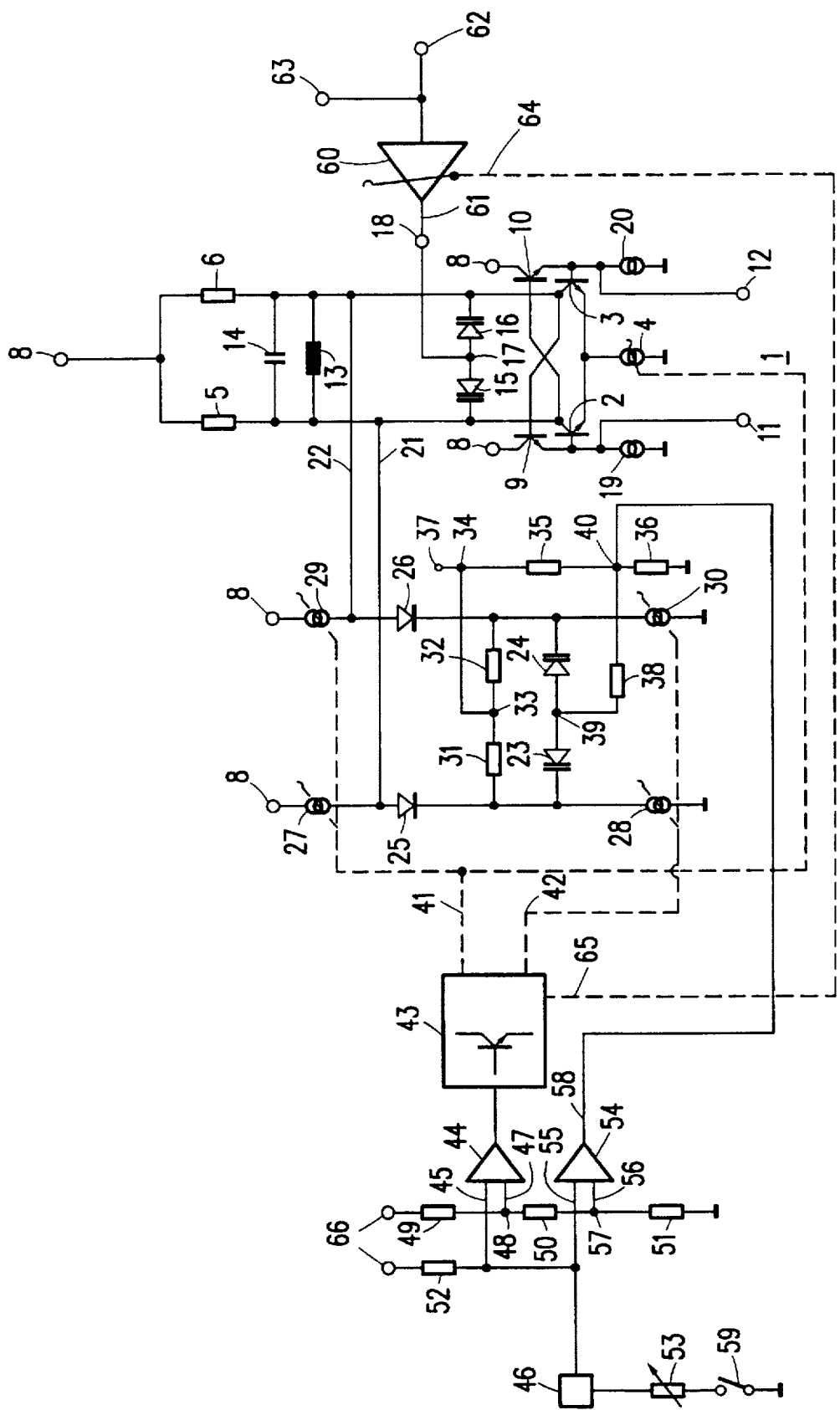

OSCILLATOR

BACKGROUND OF THE INVENTION

1. Field of the Invention

The invention relates to an oscillator having first frequency-determining elements for providing a first oscillation frequency, at least second frequency-determining elements connectable to the first frequency-determining elements via at least a switching diode for adjusting the oscillator to a second oscillation frequency, said oscillator further comprising a supply circuit which comprises at least a controllable current source, said supply circuit being coupled to the switching diode for optionally switching the switching diode between a conducting state and a blocked state, and comprising a current source feeding the oscillator.

2. Description of the Related Art

An oscillator of this type is known from DE-OS 43 14 424, corresponding to U.S. Pat. No. 5,434,543. This oscillator has a simple structure and is switchable and tunable at a plurality of oscillation frequencies.

Particularly when integrating such an oscillator on a semiconductor body, it is efficient, for reasons of manufacturing costs, to use a transistor, particularly a high-frequency transistor, as a switching diode, whose base and collector are interconnected. However, a switching diode having such a structure has a proportionally high impedance, also in the conducting state. Other constructive solutions for the structure of the switching diode have proved to be either too costly or are beset with other drawbacks which are due to, for example, parasitic transistor structures having an inadmissibly high substrate current which, in turn, would have an uncontrolled influence on the operating conditions, particularly the operating point of the oscillator.

SUMMARY OF THE INVENTION

It is an object of the invention to improve an oscillator of the type described in the opening paragraph in such a way that also a switching diode having a relatively high impedance can be used in the conducting state without this noticeably affecting the capabilities of the oscillator.

According to the invention, in an oscillator of the type described in the opening paragraph, this object is achieved in that the current source feeding the oscillator is switchable by means of the supply circuit, jointly with the connection of the controllable current source to a supply current which is dimensioned, with respect to a current available from the controllable current source, in such a way that influences exercised on the operating point and the oscillation amplitude of the oscillator are at least substantially compensated by the connection of at least one of the second frequency-determining elements.

Due to the relatively high impedance of the switching diode in the conducting state, the oscillator has a stronger attenuation in the case where it operates at the second oscillation frequency due to the connection of the second frequency-determining element, as compared with the case where it is operated at the first oscillation frequency with the first frequency-determining elements only. To compensate for this attenuation, the current, which can be supplied by the controllable current source and feeds the oscillator, may be adapted accordingly in the conducting state of the switching diode, but this may lead to a shift of the operating point of the oscillator. To compensate for this influence on the operating point, simultaneously with a compensation of the influence on the oscillation amplitude of the oscillator, the current supplied by the controllable current source is therefore also switched, accordingly.

The invention thus ensures that a simple structure of the oscillator and the attendant use of switching diodes having unfavorable impedance values nevertheless lead to a uniform and satisfactory operating behavior. Particularly, a simple high-frequency transistor short-circuited between the base and the collector may be used as a switching diode, which can easily be integrated with the rest of the circuit.

A further advantageous embodiment of an oscillator according to the invention, which comprises a differential amplifier stage consisting of two transistors whose emitters are jointly connected to ground via the current source feeding the oscillator and whose collectors are connected to a power supply terminal via respective collector resistors, is characterized in that the current source feeding the oscillator is switched in such a way that corresponding currents flow in the collector resistors in both switching states of the switching diode. It is thereby achieved, in a simple manner, that the operating point of the oscillator remains unchanged when connecting the second frequency-determining element, because the potential ratios at the collector resistors do not change.

These and other aspects of the invention will be apparent from and elucidated with reference to the embodiments described hereinafter.

BRIEF DESCRIPTION OF THE DRAWING

In the drawing:

the sole FIGURE shows the circuit diagram of an embodiment according to the invention.

DESCRIPTION OF THE PREFERRED EMBODIMENT

An oscillator 1 comprises a differential amplifier stage consisting of two transistors 2, 3 whose emitters are jointly connected to ground via a current source 4. The collectors of the transistors 2, 3 are connected to a power supply terminal 8 via collector resistors 5, 6, respectively. Each collector of the transistors 2, 3 is connected to the base of emitter-follower transistors 9, 10, respectively, whose collectors are connected to power supply terminal 8 and whose emitters are connected to output terminals 11, 12. A connection with the base of one of the transistors 2, 3 of the differential amplifier stage is realized for each emitter-follower transistor 9, 10 via its emitter, so that the collector of one of the transistors 2, 3 is coupled to the base of the respective other transistor 3, 2 of the differential amplifier stage via each of the emitter-follower transistors 9, 10. In this way, a positive feedback is obtained. The first frequency-determining elements for a first oscillation frequency are connected between the collectors of the transistors 2, 3 of the differential amplifier stage and comprise an inductance 13, a capacitance 14 and a tunable element in the form of two series-opposed capacitance diodes 15, 16 whose junction point 17 is connected to a control voltage terminal 18 via which a reverse bias voltage can be impressed on the capacitance diodes 15, 16. The oscillator i can then be adjusted to the first oscillation frequency via the control voltage terminal 18.

To feed the emitter-follower transistors 9, 10, their emitters are connected to current sources 19 and 20, respectively, which are connected to ground.

The oscillator 1 can also be operated as a voltage-controlled oscillator via the control voltage terminal 18, for example, when it is used in a phase-locked loop.

To switch the oscillator 1 to a second oscillation frequency, second frequency-determining elements, comprising two series-opposed capacitance diodes 23, 24, are arranged in parallel with the first frequency-determining elements 13 to 16 via connections 21, 22. The second frequency-determining elements 23, 24 are connected to the connections 21 and 22 via switching diodes 25, 26, respectively. Two controllable current sources 27, 28 and 29, 30 are arranged between the power supply terminal 8 and ground, in series with each of the switching diodes 25, 26. This is realized in such a way that one of the current sources is connected by means of one of its terminals to one of the junction points between the connection 21 and the first switching diode 25, between the connection 22 and the second switching diode 26, between the first switching diode 25 and the first capacitance diode 23 of the second frequency-determining element, and between the second switching diode 26 and the second capacitance diode 24 of the second frequency-determining element, while a further terminal of the current sources 27 to 30 is connected either to the power supply terminal 8 or to ground. Thus, the first switching diode 25 is fed by the controllable current sources 27 and 28 and the second switching diode 26 is fed by the controllable current sources 29 and 30. By switch-over, switch-on and switch-off of the controllable current sources 27 to 30, either a direct current can be impressed on the switching diodes 25, 26, by which current they are rendered conducting, or the controllable current sources 27 to 30 can be rendered currentless so that also the switching diodes 25, 26 are blocked. In the first-mentioned case, the second frequency-determining elements 23, 24 are arranged parallel to the first frequency-determining elements 13 to 16, and in the second case, this connection is interrupted and the oscillator 1 operates at the first oscillation frequency.

A series arrangement of two resistors 31, 32 is arranged parallel to the series arrangement of the capacitance diodes 23, 24, and the junction point 33 of these resistors is connected to a further reference voltage terminal 37. A resistive voltage divider comprising two resistors 35 and 36 is arranged between the reference voltage terminal 37 and ground. A further resistor 38 is connected to the junction point 39 between the capacitance diodes 23 and 24 and to a tap 40 of the resistive voltage divider 35, 36 which is constituted by the junction point of the two resistors 35 and 36. The capacitance diodes 23, 24 are reverse-biased via the resistive voltage divider 35, 36 as well as the resistors 31, 32, 38, while the circuit arrangement is dimensioned in such a way that the switching diodes 25, 26 are reliably blocked when the current sources 27 to 30 are switched off.

Advantageously, the controllable current sources 27 to 30 are interconnected in a common current mirror configuration. To this end, each of the controllable current sources 27 to 30 comprises at least a current source transistor and the control terminals of these current source transistors are pair-wise combined in accordance with the operating connections 41 and 42 shown in broken lines in the FIGURE. Particularly, the current sources 27, 29 connected to the power supply terminal 8 and the current sources 28, 30 connected to ground are controlled in common by the operating connections 41 and 42, respectively, preferably by way of a direct connection of the control terminals of the current source transistors present in these current sources. A current control circuit 43 preferably comprises a current mirror which commonly controls the operating connections 41 and 42. The input branch or primary branch of this current mirror in the current control circuit 43 can be switched off or bridged via a switching transistor so that it can optionally be rendered currentless and, consequently, also the controllable current sources 27 to 30 are rendered currentless via the operating connections 41, 42. This switching transistor is symbolically shown within the circuit block representing the current control circuit 43.

The operating connection 41 is further connected to the current source 4 feeding the oscillator 1. Consequently, the current control circuit 43 can switch over the current source 4 in common with the controllable current sources 27 and 29 when the second frequency-determining elements 23, 24 are connected. This switch-over is performed in such a way that for the case where the oscillator 1 is switched to the second (lower) oscillation frequency, i.e., when the switching diodes 25, 26 are rendered conducting, the supply current supplied by the current source 4 is increased as compared with the operating condition in which the switching diodes 25, 26 are blocked. This increase of the supply current in the current source 4 is equal to the sum of the differences between the currents of the controllable current sources 27, 28 and 29, 30. In addition to the currents conveyed by the controllable current sources 28, 30, the controllable current sources 27, 29 supply the current amount by which the supply current of the current source 4 was increased. It is thereby ensured that the current through the collector resistors 5, 6 remains unchanged when the second frequency-determining elements 23, 24 are connected so that the operating point of the oscillator 1, and hence, that of the capacitance diodes 15, 16 in the oscillator 1 remains constant.

The current control circuit 43 is controlled by a first driver stage 44 of which essentially the switching transistor within the current control circuit 43 is activated. The first driver stage 44 particularly comprises a differential amplifier whose first input 45 is connected to a control signal terminal 46 and whose second input 47 is connected to a first tap 48 of a second resistive voltage divider comprising three resistors 49, 50, 51 arranged between a further reference voltage terminal 66 and ground. A threshold value is made available by the second resistor voltage divider 49, 50, 51 at its first tap 48, at which value the control signal at the control signal terminal 46 switches the controllable current sources 27 to 30 and hence connects or disconnects the second frequency-determining elements 23, 24 when this control signal exceeds or falls below the threshold value. In the FIGURE, the control signal is made available at the control signal terminal 46 via a further voltage divider consisting of a resistor 52 connected by the control signal terminal 46 to the reference voltage terminal 66 and a variable resistor 53 connected by the control signal terminal 46 to ground. The connection between the resistor 53 and ground may preferably be interruptible by means of a switching device 59. In particular, the overall circuit arrangement described so far may be integrated on a semiconductor body and the control signal terminal 46 may preferably be an external terminal of the integrated circuit arrangement thus formed. The variable resistor 53 may then be constituted, for example, by a control transistor or a potentiometer.

However, in the circuit arrangement according to the invention, the second frequency-determining elements are also tuned to the desired, second oscillation frequency of the oscillator 1 when these elements are connected or disconnected via the control signal terminal 46. To this end, a second driver stage 54 is provided, whose first input 55 is also connected to the control signal terminal 46 and whose second input 56 is connected to a second tap 57 of the second resistive voltage divider 49 to 51. The output 58 of the second driver stage 54 is connected to the second tap 40 of the resistive voltage divider 35, 36.

As compared with the threshold value taken from the first tap 48 for the first driver stage 44, the threshold value given for the second driver stage 54 by the voltage at the second tap 57 is dimensioned in such a way that the threshold value at the first driver stage 44 limits a control range of the second driver stage 54, which range is fixed by the threshold value at this second driver stage 54. The second driver stage 54 preferably also comprises a differential amplifier, and the control range of the voltage between the inputs 55 and 56, within which range this voltage is in a linear relationship with a signal thus produced at the output 58, is brought to such a level by choosing the threshold value at the second tap 57 that the control signal at the control signal terminal 46 reaches the threshold value at the first input 45 of the first driver stage 44 and thus disconnects the second frequency-determining elements 23, 24 when a limit (preferably the upper limit) of this control range is reached. Within said control range, an adjusting voltage for varying the capacitances of the capacitance diodes 23, 24 is superimposed at the second tap 40 on the bias voltage of the second frequency-determining elements 23, 24 by the second driver stage 54.

In the embodiment shown in the FIGURE, the collector resistors 5, 6, the current sources 27 and 29 and the collectors of the emitter-follower transistors 9, 10 are connected to the same power supply terminal 8 for the sake of simplicity. Dependent on the potentials required, several power supply terminals may be provided for this purpose.

In an example of dimensioning the oscillator according to the invention, used in a television-IF-PLL circuit for switching between the French video signal transmission standards L and L', the first oscillation frequency is twice as large as the picture carrier frequency of 38.9 MHz for the transmission standard L and the second oscillation frequency is twice as large as the picture carrier frequency of 33.9 MHz for the transmission standard L'. The second frequency-determining elements 23, 24 are connected by closing the switching device 59 when the oscillator is set at the transmission standard L'. A setting range of approximately 1.2 MHz can be achieved for the oscillator 1 with the connected second frequency-determining elements via the variable resistor 53, the second driver stage 54 and the variation of the capacitances of the capacitance diodes 23, 24. Moreover, the oscillator according to the invention has a low variation of the oscillation frequency when it is above the operating temperature and the operating voltage.

When adjusting an oscillator, as described hereinbefore, via the control voltage terminal 18, it appears that the slope of the adjusting characteristic, i.e., the dependence of the oscillation frequency variation on the variation of the reverse bias voltage at the reference voltage terminal 18 is changed upon setting to the various oscillation frequencies. This variation of the slope is based on the different values of the frequency-determining elements, preferably of the capacitance diodes for the different oscillation frequencies. Particularly, when the described oscillator is used in a phase-locked loop, the different slopes have their effect on a variation of the control behavior of the control loop between the different oscillation frequencies.

This phenomenon can be obviated by an amplifier element 60 having a gain factor which is switchable, jointly with the connection of at least one of the second frequency-determining elements 23, 24. An adjusting signal, from which the reverse bias voltage results with said gain factor at the control voltage terminal 18, is applied to the control voltage terminal 18 via this amplifier element 60. The gain factor of the amplifier element 60 for each of the oscillation frequencies is preferably chosen to be such that adjusting characteristics have at least substantially corresponding slopes for the adjustment of the oscillator 1 to all adjustable oscillation frequencies by the adjusting signal. Thus, the "transmission ratios" deviating due to the different slopes between an applied control signal and a variation of the oscillation frequency are corrected by the different gain factors so that, overall, there are always at least substantially equal characteristics between the control signal, on the one hand, and the variations of the oscillation frequencies, on the other hand. A phase-locked loop incorporating the oscillator 1 then has an identical control behaviour at all adjustable oscillation frequencies.

In the embodiment shown in the FIGURE, the output 61 of the amplifier element 60 is connected to the control voltage terminal 18. An input 62 of the amplifier element 60 receives the control signal. The input 62 is also connected to a terminal 63 via which this control signal can be applied as an AFC voltage to other signal-processing stages. The gain factor of the amplifier element 60 is adjusted to the desired value via a switching input 64. To this end, the switching input 64 is connected to an output 65 of the current control circuit 43 which has a function equivalent to that of the operating connections 41, 42, the controllable current sources 27 to 30 and the amplifier element 60 are then simultaneously controlled or switched over by the current control circuit 43.

In a modification of this embodiment, the input 62 of the amplifier element 60 may be connected to the control voltage terminal 18 and its output 61 may be connected to the terminal 63. The control signal is then directly applied as a reverse bias voltage to the capacitance diodes 15, 16 from the control voltage terminal 18 and applied to the input 62 of the amplifier element 60. After an amplification, which is predetermined by the switchable gain factor and again compensates the different slopes of the characteristics between the reverse bias voltage and the oscillation frequency, the control signal reaches the terminal 63 as an AFC signal.

I claim:

1. An oscillator having first frequency-determining elements for providing a first oscillation frequency, at least second frequency-determining elements connectable to the first frequency-determining elements via at least a switching diode for adjusting the oscillator to a second oscillation frequency, said oscillator further comprising a supply circuit which comprises at least a controllable current source, said supply circuit being coupled to the switching diode for optionally switching the switching diode between a conducting state and a blocked state, and comprising a current source feeding the oscillator, characterized in that the current source feeding the oscillator is switchable by means of the supply circuit, jointly with the connection of the controllable current source to a supply current which is dimensioned, with respect to a current available from the controllable current source, in such a way that influences exercised on the operating point and the oscillation amplitude of the oscillator are at least substantially compensated by the connection of at least one of the second frequency-determining elements.

2. An oscillator as claimed in claim 1, comprising a differential amplifier stage consisting of two transistors whose emitters are jointly connected to ground via the current source feeding the oscillator, and whose collectors are connected to a power supply terminal via respective collector resistors, characterized in that the current source feeding the oscillator is switched in such a way that corresponding currents flow in the collector resistors in both switching states of the switching diode.

3. An oscillator as claimed in claim 1, characterized in that the first frequency-determining elements comprise a first capacitance with which a second capacitance (23, 24) as the second frequency-determining element (23, 24) is connectable in parallel via at least one of the switching diodes (25, 26)].

4. An oscillator as claimed in claim 1, characterized in that the supply circuit comprises a first driver stage for controlling the controllable current source.

5. An oscillator as claimed in claim 1, characterized in that said oscillator further comprises an amplifier element having a gain factor which is switchable, jointly with the connection of at least one of the second frequency-determining elements, said amplifier element providing a control signal applicable to the first frequency-determining elements.

6. An oscillator as claimed in claim 5, characterized in that the main factor for each of the oscillation frequencies is chosen to be such that control characteristics have at least substantially corresponding slopes for the control of the oscillator to all adjustable oscillation frequencies by the control signal.

7. An oscillator as claimed in claim 2, characterized in that the supply circuit comprises a first driver stage for controlling the controllable current source.

8. An oscillator as claimed in claim 3, characterized in that the supply circuit comprises a first driver state for controlling the controllable current source.

9. An oscillator as claimed in claim 2, characterized in that said oscillator further comprises an amplifier element having a main factor which is switchable, jointly with the connection of at least one of the second frequency-determining elements, said amplifier element providing a control signal applicable to the first frequency-determining elements.

10. An oscillator as claimed in claim 3, characterized in that said oscillator further comprises an amplifier element having a main factor which is switchable, jointly with the connection of at least one of the second frequency-determining elements, said amplifier element providing a control signal applicable to the first frequency-determining elements.

11. An oscillator as claimed in claim 4, characterized in that said oscillator further comprises an amplifier element having a gain factor which is switchable, jointly with the connection of at least one of the second frequency-determining elements, said amplifier element providing a control signal applicable to the first frequency-determining elements.

12. An oscillator as claimed in claim 7, characterized in that said oscillator further comprises an amplifier element having a gain factor which is switchable, jointly with the connection of at least one of the second frequency-determining elements, said amplifier element providing a control signal applicable to the first frequency-determining elements.

13. An oscillator as claimed in claim 8, characterized in that said oscillator further comprises an amplifier element having a gain factor which is switchable, jointly with the connection of at least one of the second frequency-determining elements, said amplifier element providing a control signal applicable to the first frequency-determining elements.

14. An oscillator as claimed in claim 9, characterized in that the gain factor for each of the oscillation frequencies is chosen to be such that control characteristics have at least substantially corresponding slopes for the control of the oscillator to all adjustable oscillation frequencies by the control signal.

15. An oscillator as claimed in claim 10, characterized in that the gain factor for each of the oscillation frequencies is chosen to be such that control characteristics have at least substantially corresponding slopes for the control of the oscillator to all adjustable oscillation frequencies by the control signal.

16. An oscillator as claimed in claim 11, characterized in that the gain factor for each of the oscillation frequencies is chosen to be such that control characteristics have at least substantially corresponding slopes for the control of the oscillator to all adjustable oscillation frequencies by the control signal.

17. An oscillator as claimed in claim 12, characterized in that the gain factor for each of the oscillation frequencies is chosen to be such that control characteristics have at least substantially corresponding slopes for the control of the oscillator to all adjustable oscillation frequencies by the control signal.

18. An oscillator as claimed in claim 13, characterized in that the gain factor for each of the oscillation frequencies is chosen to be such that control characteristics have at least substantially corresponding slopes for the control of the oscillator to all adjustable oscillation frequencies by the control signal.

* * * * *